US005517140A

United States Patent [19]
Hatsuda

[11] Patent Number: 5,517,140
[45] Date of Patent: May 14, 1996

[54] SAMPLE AND HOLD CIRCUIT

[75] Inventor: Tsuguyasu Hatsuda, Osaka, Japan

[73] Assignee: Matsushita Electric Industrial Co., Ltd., Osaka, Japan

[21] Appl. No.: 421,184

[22] Filed: Apr. 13, 1995

[30] Foreign Application Priority Data

Apr. 14, 1994 [JP] Japan ..................... 6-075854

[51] Int. Cl.[6] ................................. H03K 5/00
[52] U.S. Cl. ................. 327/95; 327/91; 327/311; 326/22
[58] Field of Search ................. 326/22, 23, 24, 326/25, 95, 98; 327/90, 91, 94, 95, 96, 311

[56] References Cited

U.S. PATENT DOCUMENTS

| | | | |
|---|---|---|---|
| 4,302,689 | 11/1981 | Brodie | 327/95 |
| 4,352,070 | 9/1982 | Beauducel et al. | 327/95 |
| 4,695,751 | 9/1987 | De La Plaza | 327/91 |
| 5,206,543 | 4/1993 | Takita et al. | 327/91 |
| 5,327,092 | 7/1994 | Inogai et al. | 327/91 |

FOREIGN PATENT DOCUMENTS 2-68799  8/1990  Japan .

*Primary Examiner*—Edward P. Westin
*Assistant Examiner*—Benjamin D. Driscoll
*Attorney, Agent, or Firm*—Willian Brinks Hofer Gilson & Lione

[57] ABSTRACT

A sample and hold circuit has an analog switch, a hold capacitor, a voltage-follower type operational amplifier, and a ringing cancel circuit. The ringing cancel circuit is interposed between a non-inverted input terminal of the operational amplifier and a signal ground so that the ringing cancel circuit is connected in parallel with the hold capacitor. The ringing cancel circuit is made up of a resistance and a capacitor connected in series with each other. With this arrangement, a high-speed, highly accurate, low power consumptive sample and hold circuit can be realized.

8 Claims, 8 Drawing Sheets

SAMPLE AND HOLD CIRCUIT

BACKGROUND OF THE INVENTION

The present invention relates to a sample and hold circuit used for processing analog signals.

FIG. 1 shows an essential arrangement of a conventional sample and hold circuit preferably used for high-speed sampling of analog signals. This sample and hold circuit comprises an analog switch 101, a hold capacitor 102, and an operational amplifier 103. The analog switch 101 comprises an n-channel MOS (metal oxide semiconductor) transistor whose gate electrode is supplied with sampling clock CLK via a control line 110, and a p-channel MOS transistor which is supplied with complementary sampling clock XCLK via another control line 111. This analog switch 101 has two terminals, one of them being connected to a signal input line through which input voltage $V_{in}$ is entered. The input voltage $V_{in}$ causes steep variations in a region between a power supply voltage $V_{DD}$ and a ground voltage $V_{SS}$. The operational amplifier 103, having a non-inverted input terminal and an inverted input terminal, has a well-known internal arrangement including a differential amplifier stage constituted by a pair of input MOS transistors. Output voltage $V_{out}$ of the operational amplifier 103 is fed back to the inverted input terminal, so that the operational amplifier 103 functions as a voltage-follower type operational amplifier having a high input impedance and a low output impedance. The other end of the analog switch 101 is connected to the non-inverted input terminal of the operational amplifier 108. The hold capacitor 102 is interposed between the non-inverted input terminal of the operational amplifier 108 and a constant-potential line (i.e. a signal ground) having a ground voltage $V_{SS}$.

According to the arrangement of FIG. 1, during sampling operation, the analog switch 101 is turned on and the hold capacitor 102 is charged or discharged in proportion to the input voltage $V_{in}$. During hold operation, the analog switch 101 is turned off, and the voltage-follower type operational amplifier 108 holds the output voltage $V_{out}$ which is proportional to the charge stored in the hold capacitor 102.

However, the above-described conventional sample and hold circuit has a problem in that the output voltage $V_{out}$ is subjected to the ringing phenomenon chiefly resulting from parasitic capacitance 120 existing between the non-inverted input terminal and the inverted input terminal of the operational amplifier 108. As a result, accuracy of output was not satisfactory. It is believed that each gate-substrate capacitance of respective input MOS transistors constituting the differential stage of the operational amplifier 108 is the cause of this parasitic capacitor. In fact, both of the input MOS transistors are mandatorily required to enlarge their gate width for reduction of noises and improvement of frequency characteristics of the sample and hold circuit. Thus, there is recognized the tendency that the gate-substrate capacitance of each input MOS transistor becomes large.

The sample and hold circuit of FIG. 1 has a transfer function $G(s)=V_{out}/V_{in}$ defined by the following formula.

$$G(s)=\omega_t/\{R_{on}(C_s+C_p)s^2 +(R_{on}C_s\omega_t+1)s+\omega_t\} \qquad (1)$$

where $R_{on}$ is an ON resistance of the analog switch 101, $C_s$ is a capacitance value of the hold capacitor 102, $C_p$ is a capacitance value of the parasitic capacitance 120, and $\omega_t=2\pi f_t$ represents an angular frequency corresponding to the GB product $f_t$ of the operational amplifier 103.

For example, the following is the settings of the sample and hold circuit used for a base-band processing section of a digital communication MODEM (modulator-demodulator) circuit.

Analog signal frequency=100 kHz
Sampling frequency=2–4 MHz
$R_{on}$=10 kΩ
$C_s=C_p=1$ pF $(=C_0)$
$f_t$=10–20 MHz For the purpose of simplifying explanation, it is assumed that the following equation is established.

$$f_t=1/(2\pi R_{on}C_0)=15.9 \text{ MHz}$$

An approximate expression of the transfer function G(s) given by the formula 1 is obtained in the following manner.

$$G(s)=\Omega_t/[2R_{on}C_0\{s^2+(1/R_{on}C_0)s+ (1/R_{on}C_0)^2/2\}] =\omega_t/\{2R_{on}C_0(s+\alpha/R_{on}C_0) (s+\beta/R_{on}C_o)\} \qquad (2)$$

where $\alpha=(1+j)/2$, $\beta=(1-j)/2$, and j is the imaginary unit.

The transfer function G(s) expressed by the formula 2 has poles of a pair of complex conjugate numbers whose real number is negative. This means that the output voltage $V_{out}$ of the FIG. 1 sample & hold circuit causes a damped oscillation, i.e. a ringing. Due to presence of this ringing, the output voltage $V_{out}$ is not stabilized during the sampling duration and, therefore, accuracy of the output is lowered. When the sampling frequency is high and, accordingly, when the sampling duration is short, deterioration of output accuracy is remarkable.

If the GB product $f_t$ of the operational amplifier 103 is infinity, the above ringing problem will be eliminated. However, GB product $f_t$ is practically finite and enlargement of The GB product $f_t$ is not preferable from the view point that power consumption of the operational amplifier 103 is increased.

SUMMARY OF THE INVENTION

Accordingly, in view of above-described problems encountered in the prior art, a principal object of the present invention is to provide a high-speed, highly accurate, low power consumptive sample and hold circuit.

In order to accomplish this and other related objects, the present invention provides a novel sample and hold circuit which employs an arrangement for interposing a ringing cancel circuit between a non-inverted input terminal of a voltage-follower type operational amplifier and a constant-potential line so that the ringing cancel circuit is connected in parallel with a hold capacitor. The ringing cancel circuit includes a resistance and a capacitor connected in series with each other.

The transfer function off the sample and hold circuit including the above-described ringing cancel circuit can have poles of negative real numbers, not the poles of a pair of complex conjugate numbers. It means that, even if a significant amount of parasitic capacitance exists between the non-inverted input terminal and the inverted input terminal of the operational amplifier, without a large increase in the GB product of the operational amplifier, an output voltage of the sample and hold circuit will show an exponential damping. That is, the output voltage can be stabilized within a short sampling duration. Hence, the present invention provides a high-speed, highly accurate, low power consumptive sample and hold circuit which is very useful when used for a sample and hold circuit incorporated in a semiconductor integrated circuit for processing analog signals.

BRIEF DESCRIPTION OF THE DRAWINGS

The above and other objects, features and advantages of the present invention will become more apparent from the following detailed description which is to be read in conjunction with the accompanying drawings, in which:

FIGS. 3A–5C are graphs showing stepwise responses of the sample and hold circuits, wherein FIG. 3A is a graph showing a waveform of an input voltage off the FIG. 2 circuit.

FIG. 4 is a circuit diagram showing a sample and hold circuit in accordance with a second embodiment of the present invention;

FIG. 5 is a cross-sectional view showing a detailed arrangement of the hold capacitor shown in FIG. 4;

DETAILED DESCRIPTION OF THE INVENTION

Hereinafter, preferred embodiments of the present invention will be explained in greater detail with reference to the accompanying drawings.

First Embodiment

Figure 1:
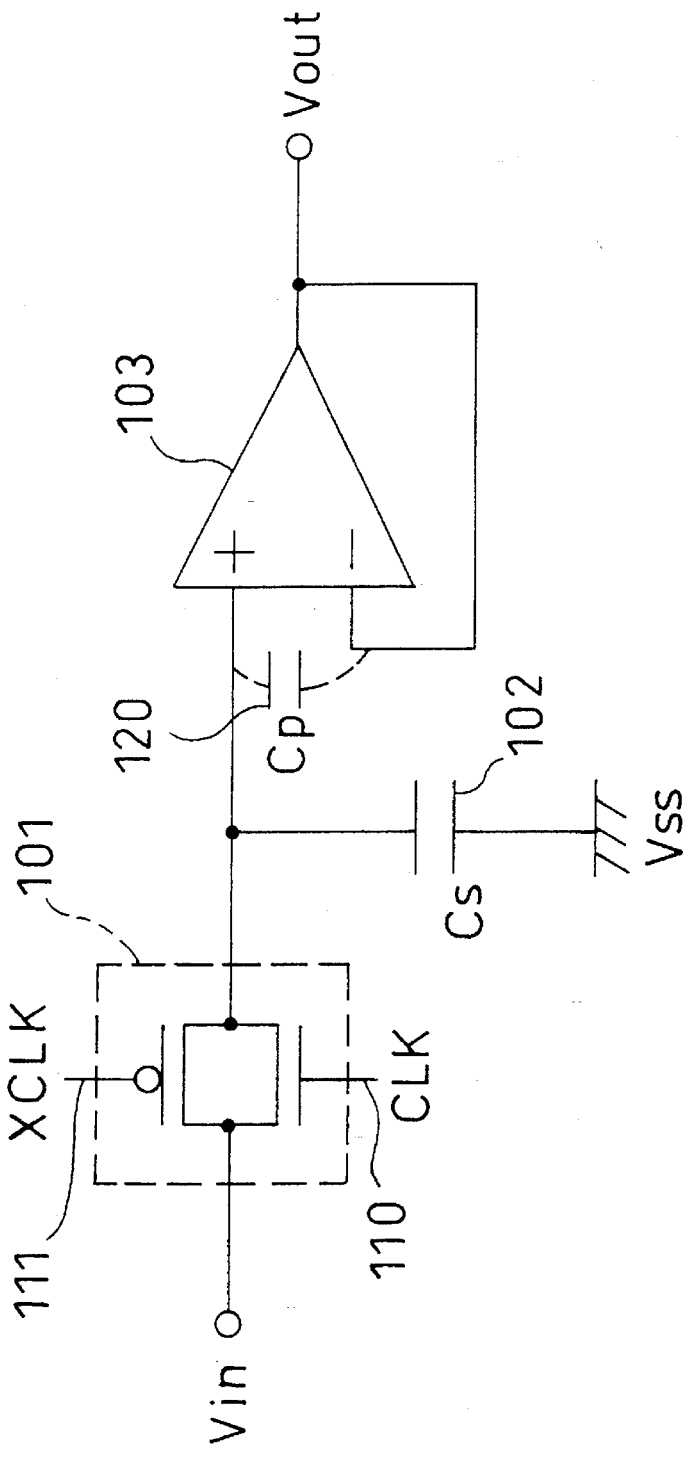
FIG. 1 is a circuit diagram showing a conventional sample and hold circuit.
Figure 2:
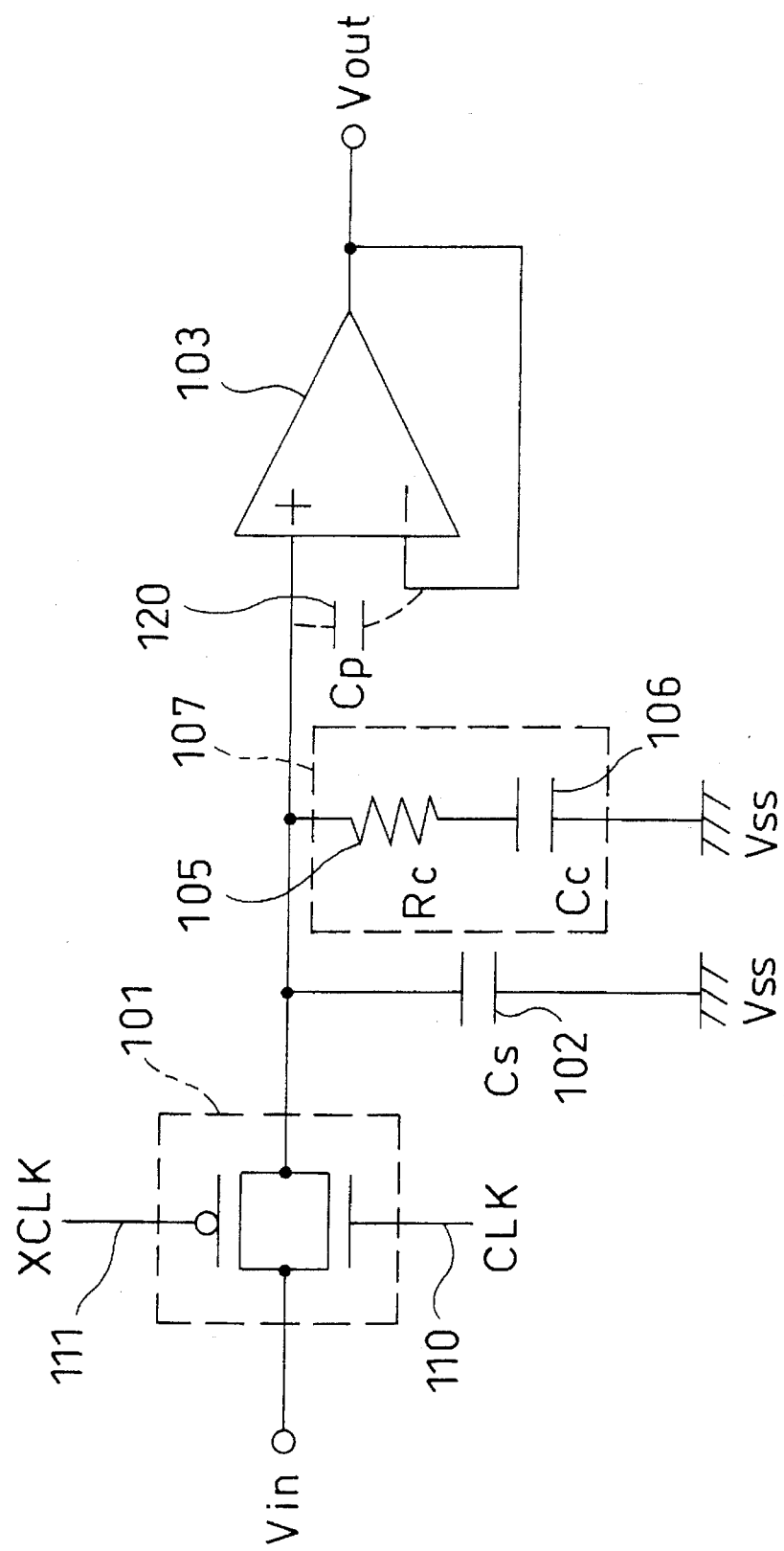
FIG. 2 is a circuit diagram showing a sample and hold circuit in accordance with a first embodiment of the present invention.

FIG. 2 shows an essential arrangement of a sample and hold circuit in accordance with a first embodiment of the present invention. This sample and hold circuit includes a ringing cancel circuit 107 in addition to the arrangement of FIG. 1. The ringing cancel circuit 107 consists of a resistance 105 and a capacitor 106 connected in series with each other. One end of the resistance 105 is connected to the non-inverted input terminal of the operational amplifier 103. The other end of the resistance 105 is connected to the constant-potential line (i.e. signal ground) having the ground voltage $V_{SS}$ via the capacitor 106. The resistance 105 can be an ordinary passive element, or an active element such as MOS transistor. The hold capacitor 102 and the capacitor 106 of the ringing cancel circuit are formed, for example, by using an inter-layer insulating film interposed between two wiring layers.

The sample and hold circuit of FIG. 2 has a transfer function $G(s)=V_{out}/V_{in}$ defined by the following formula.

$$G(s)=\{\omega_t(R_cC_cs+1)\}/F(s) \quad (3)$$

$$F(s)=R_{on}R_c(C_s+C_p)C_cs^3 +\{R_{on}(C_s+C_p+C_c)+R_cC_c+\omega_tR_{on}R_cC_cC_s\}s^{2+}\{\omega_t(R_{on}C_s+R_{on}C_c+R_cC_c)+1\}s+\omega_t \quad (4)$$

where $R_{on}$ is an ON resistance of the analog switch 101, $R_c$ is a resistance value of the resistance 105, $C_s$ is a capacitance value of the hold capacitor 102, $C_p$ is a capacitance value of the parasitic capacitance 120, $C_c$ is a capacitance value of the capacitor 106, and $\omega_t=2\pi f_t$ represents an angular frequency corresponding to the GB product $f_t$ of the operational amplifier 103.

For example, the following is the settings of the sample and hold circuit used for a base-band processing section of a digital communication MODEM circuit.

Analog signal frequency=100 kHz
Sampling frequency: 2–4 MHz
$R_{on}=R_c=10\ \Omega\ (=R_0)$
$C_s=C_p=C_c=1$ pF $(=C_0)$
$f_t=10$–20 MHz For the purpose of simplifying explanation, it is assumed that the following equation is established.

$$f_t=1/(2\pi R_0 C_0)=15.9\ \text{MHz}$$

An approximate expression of the denominator F(s) of the transfer function given by the formula 4 is obtained in the following manner.

$$F(s)=2(R_0C_0)^2s^3+5(R_0C_0)^2s^2+4s+1/R_0C_0 \quad (5)$$

Furthermore, an approximate expression of the transfer function G(s) is obtained from the Formulas 3 and 5.

$$\begin{aligned}
G(s) &= R_0C_0\omega_t(R_0C_0s+1)/\{2(R_0C_0)^3s^3+ \\
&\quad 5(R_0C_0)^2s^2+4(R_0C_0)s+1\} \\
&= R_0C_0\omega_t(R_0C_0s+1)/[\{2(R_0C_0)s+1\}(R_0C_0s+1)^2] \\
&= \omega_t(s+1/R_0C_0)/[2R_0C_0\{s+1/2(R_0C_0)\}(s+1/R_0C_0)^2] \\
&= \omega_t/[2R_0C_0\{s+1/2(R_0C_0)\}(s+1/R_0C_0)]
\end{aligned} \quad (6)$$

The transfer function G(s) expressed by the formula 6 has two poles of negative real numbers. It means that the output voltage $V_{out}$ of the FIG. 2 sample and hold circuit shows an exponential damping. That is, even if the parasitic capacitance 120 exists between the non-inverted input terminal and the inverted input terminal of the operational amplifier 103, or without increasing the GB product $f_t$ of the operational amplifier 103 so largely, the output voltage $V_{out}$ can be stabilized within a short sampling duration and, therefore, its output accuracy can be improved.

Figure 3A:
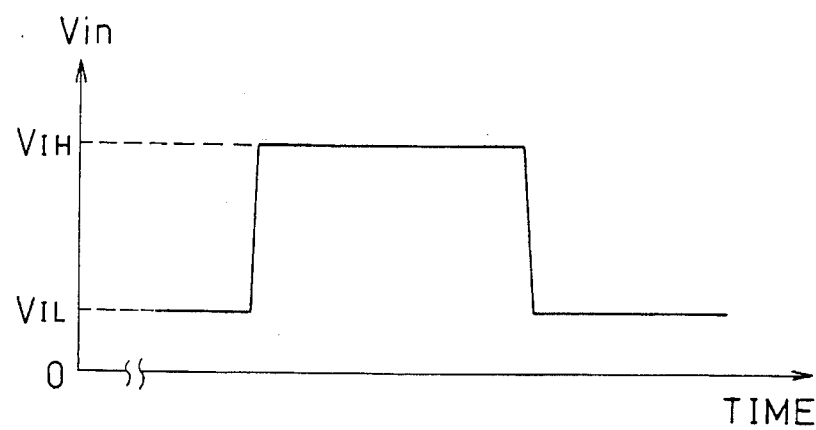
Figure 3B:
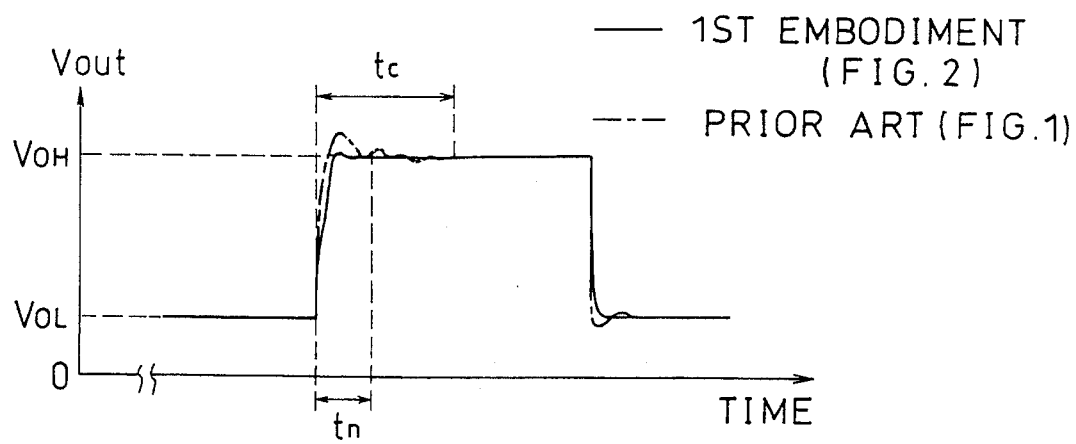
FIG. 3B is a graph showing a waveform off an output voltage of the FIG. 2 circuit responsive to the input voltage of FIG. 3A together with a waveform of an output voltage of the FIG. 1 circuit.
Figure 3C:
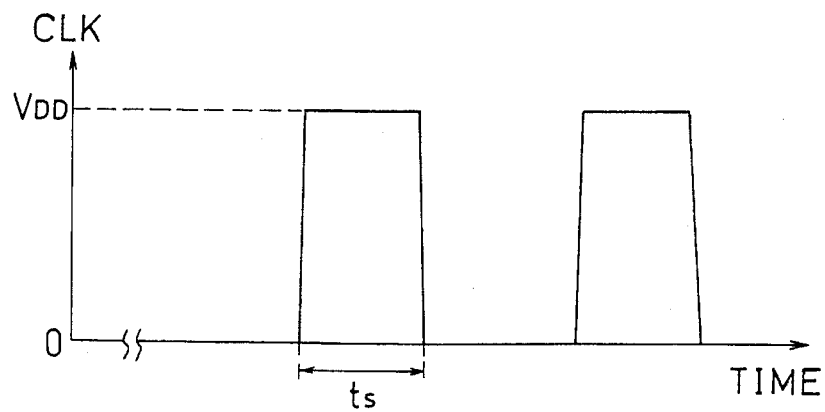
FIG. 3C is a graph showing a waveform of a sampling clock of the FIG. 2 circuit.

FIGS. 3A–3C are graphs showing stepwise responses of the sample and hold circuits. The input voltage $V_{in}$ steeply varies from a low voltage $V_{IL}$ to a high voltage $V_{IH}$, as shown in FIG. 3A. The sampling clock CLK becomes a high voltage $V_{DD}$ during a sampling duration $t_s$, as shown in FIG. 3C. The output voltage $V_{out}$ of the FIG. 2 sample and hold circuit takes a time $t_n$ for transition from a low voltage $V_{OL}$ to a high voltage $V_{OH}$ without ringing as shown in FIG. 3B, where $t_n<t_s$. On the other hand, the output voltage $V_{out}$ of the FIG. 1 sample and hold circuit causes ringing phenomenon and takes a relatively long time $t_c$ for variation from the low voltage $V_{OL}$ to the high voltage $V_{OH}$ under the same conditions, as shown by an alternate long and short dash line in FIG. 3B, where $t_c>t_s$.

As explained above, the first embodiment adopts an arrangement of providing the ringing cancel circuit 107 consisting of the resistance 105 and the capacitor 106 in addition to the arrangement of FIG. 1. Hence, it becomes possible to realize a high-speed, highly accurate, Low power consumptive sample and hold circuit.

Second Embodiment

Figure 4:
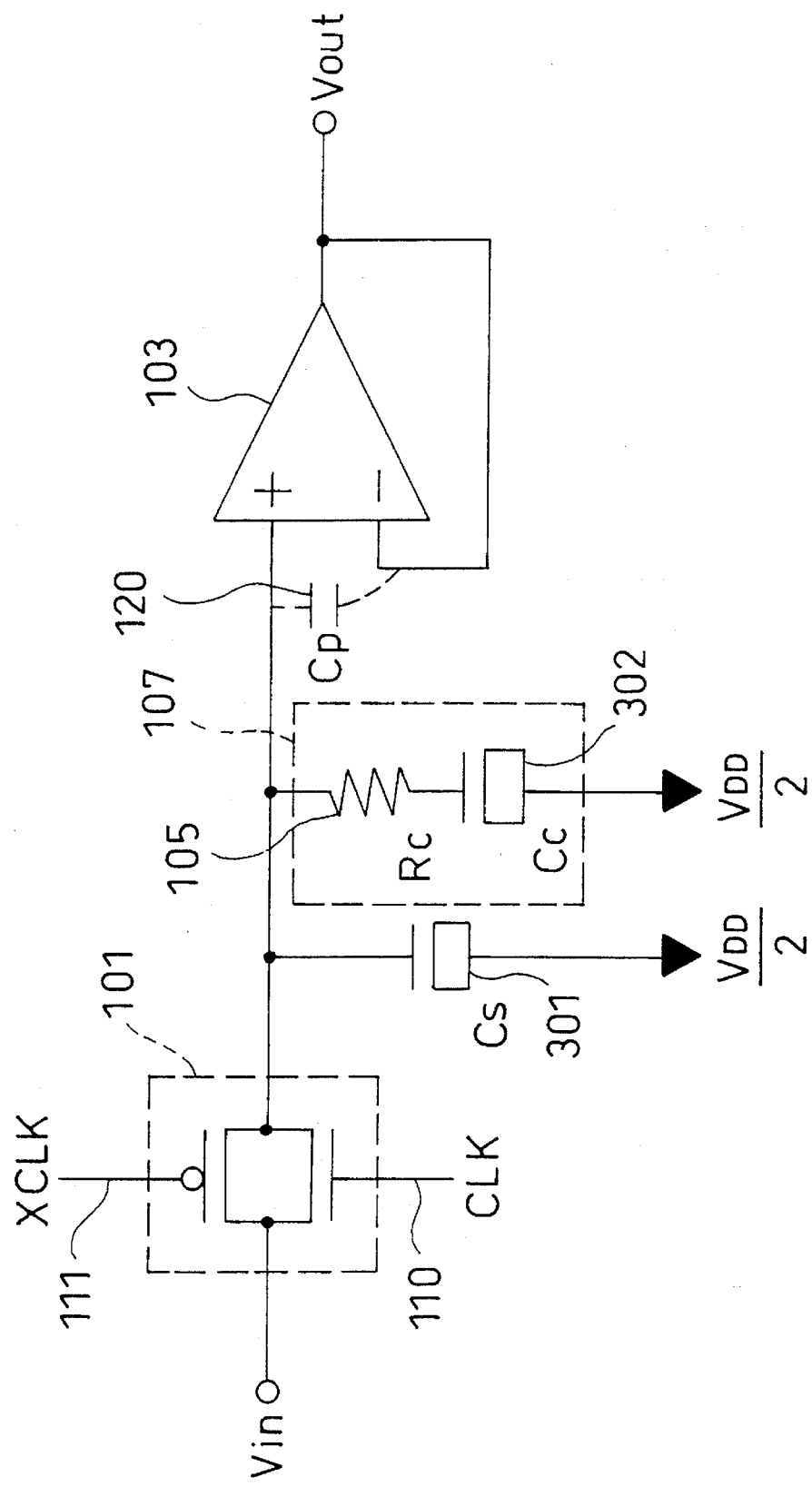

FIG. 4 shows an essential arrangement of a sample and hold circuit in accordance with a second embodiment of the present invention. This sample and hold circuit comprises a hold capacitor 801 and a capacitor 302 of a ringing cancel circuit, each being constituted by two MISs (metal insulator semiconductors) connected in anti-parallel with each other. Furthermore, one end of each of the hold capacitor 301 and the capacitor 302 of the ringing cancel circuit is connected to a constant-potential line having a half of the power supply voltage $V_{DD}$. Other configuration is identical with that of FIG. 2.

Figure 5:
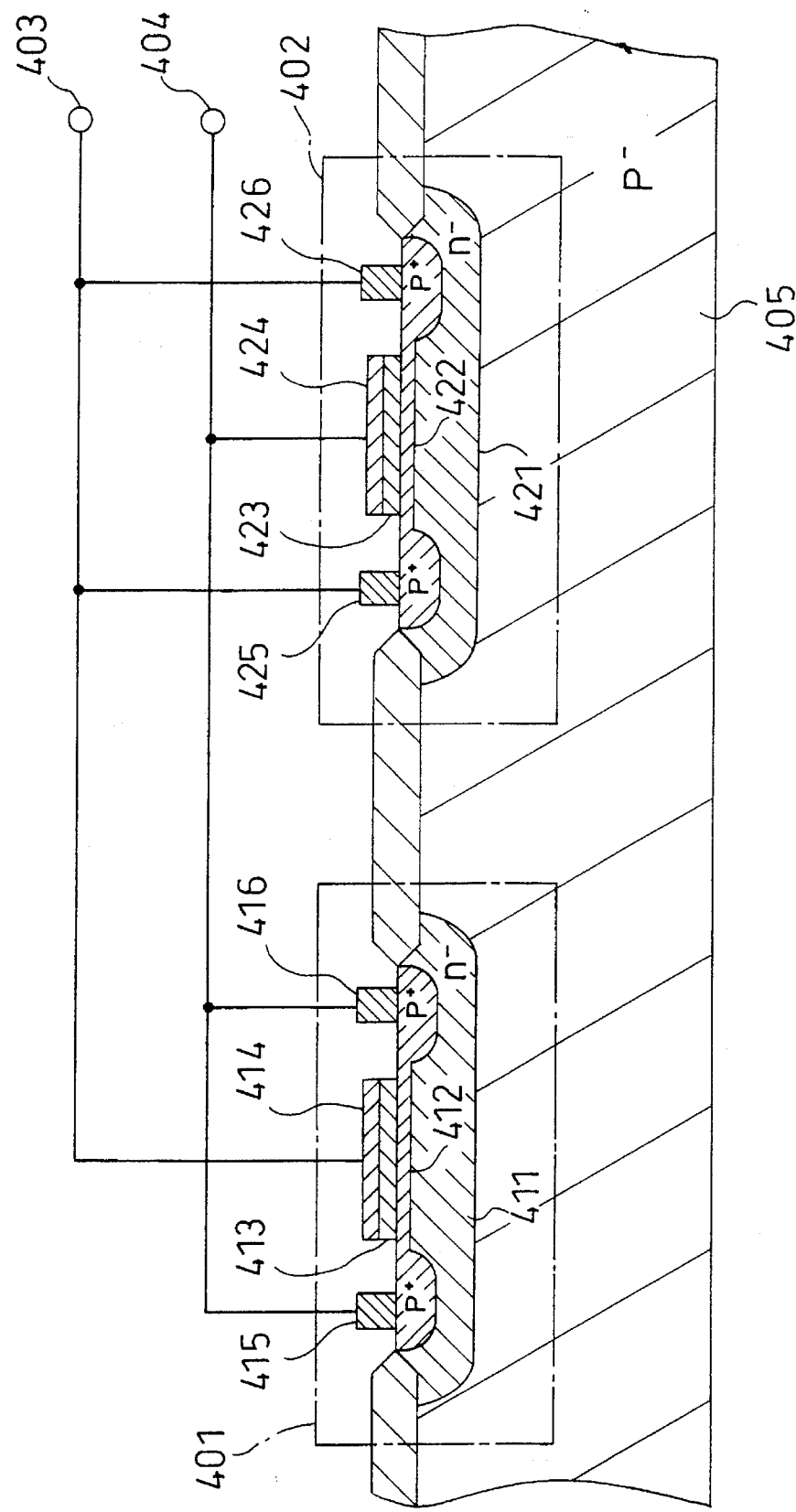

FIG. 5 shows a cross-sectional arrangement of the hold capacitor 801. More specifically, the hold capacitor 301 comprises first and second MIS capacitors 401 and 402. The first MIS capacitor 401 comprises an n-well 411 formed on the surface of p-type semiconductor substrate 405, a p-type semiconductor layer 412 formed on the surface of the n-well 411, a thin insulating layer 413 formed on the p-type semiconductor layer 412, a gate electrode 414 formed on the insulating layer 413, and extension electrodes 415 and 416 formed on the bared portion of the p-type semiconductor layer 412. The second MIS capacitor 402 comprises an n-well 421 formed on the surface of p-type semiconductor substrate 405, a p-type semiconductor layer 422 formed on the surface of the n-well 421, a thin insulating layer 428 formed on the p-type semiconductor layer 422, a gate electrode 424 formed on the insulating layer 423, and extension electrodes 425 and 426 formed on the bared portion of the p-type semiconductor layer 422. The gate electrode 414 of the first MIS capacitor and the extension electrodes 425 and 426 of the second MIS capacitor are connected to a first extension wire 403 of the hold capacitor 801. The extension electrodes 415 and 416 of the first MIS capacitor and the gate electrode 424 of the second MIS capacitor are connected to a second extension wire 404 of the hold capacitor 801. Of the p-type semiconductor layers 412 and 422 of the first and second MIS capacitors, portions beneath the insulating layers 413 and 428 act as channel regions. The capacitor 802 of the ringing cancel circuit has a cross-sectional arrangement similar to FIG. 5.

The first and second MIS capacitors 401 and 402 have the thin insulating layers 418 and 428 as dielectric layers. Each can provide a large capacitance value by a small area. Both of MIS capacitors 401 and 402 have capacitance values whose voltage dependency varies in accordance with positive or negative of an applied voltage between gate electrodes 414 and 424 and p-type semiconductor layers 412 and 422. Hence, these MIS capacitors 401 and 402 are connected in anti-parallel with each other, as shown in FIG. 5. With this connection, the voltage dependency of the capacitance value of the hold capacitor 301 is symmetrically centered on a case off an applied voltage 0. Furthermore, the voltage dependency of the capacitance value is small in the vicinity of the applied voltage 0. Meanwhile, the FIG. 4 sample and hold circuit receives input voltage $V_{in}$ varying in the region between the power supply voltage $V_{DD}$ and the ground voltage $V_{SS}$. One end of the hold capacitor 301 is connected to the constant-potential line having a half of the power supply voltage $V_{DD}$. Accordingly, an applied voltage across the hold capacitor 801 is $V_{DD}/2$ at maximum. Thus, the hold capacitor 301 can be used in a voltage region where voltage dependency of the capacitance value is small. The same may be said of the capacitor 302 of the ringing cancel circuit.

As explained above, according to the second embodiment, a pair of MIS capacitors connected in anti-parallel with each other is used to constitute the hold capacitor 801 and the capacitor 302 of the ringing cancel circuit. Furthermore, one end of each of the capacitors 801 and 802 is connected to a constant-potential line of voltage $V_{DD}/2$. Thus, not only an area of each of the capacitors 801 and 802 can be reduced, but both of the capacitors 301 and 802 can be used in a voltage region where voltage dependency off the capacitance value is small. The end voltage of each of the capacitors 801 and 802 can be set roughly at $V_{DD}/2$. Other effects are similar to those off the first embodiment.

Third Embodiment

Figure 6:
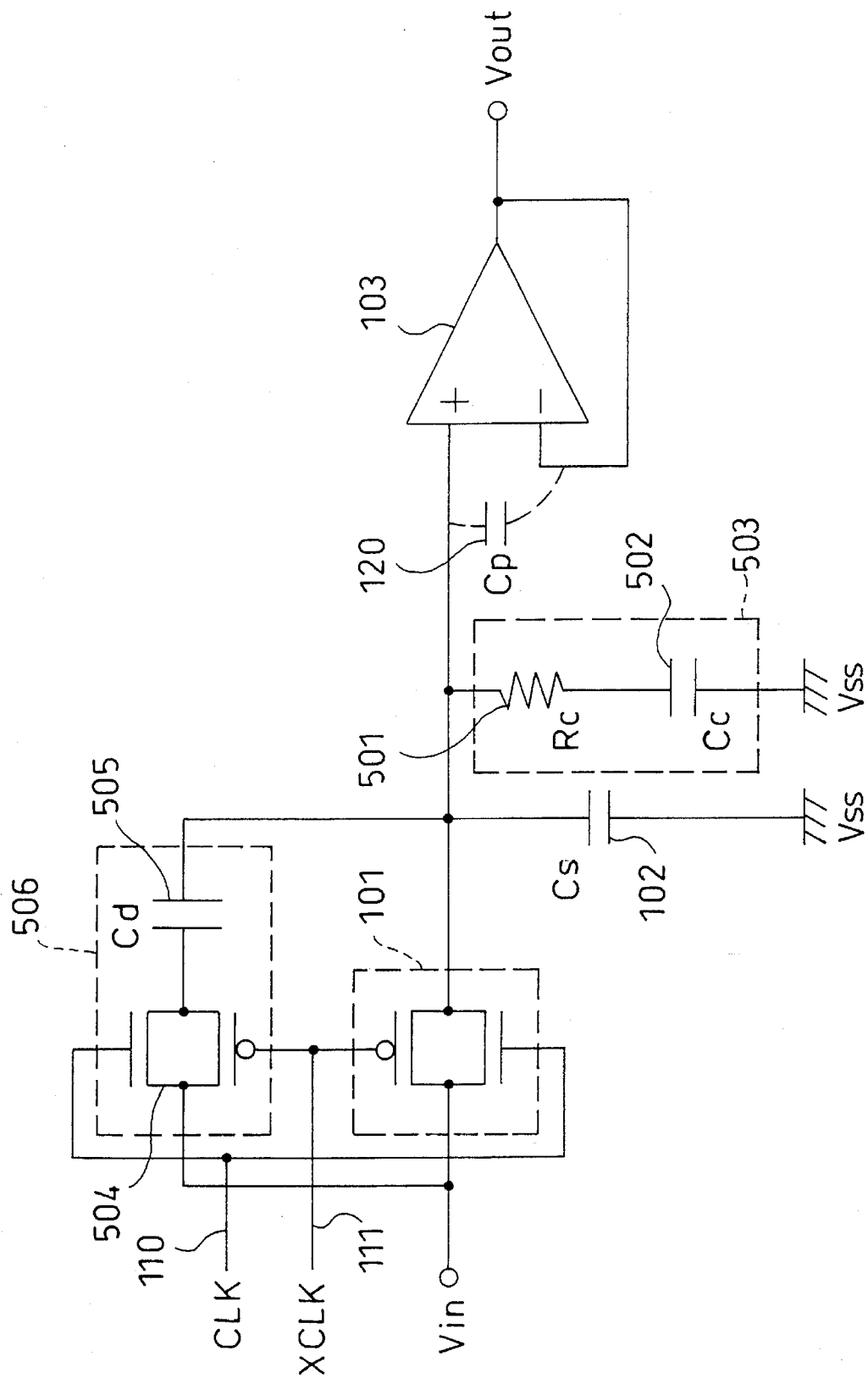
FIG. 6 is a circuit diagram showing a sample and hold circuit in accordance with a third embodiment of the present invention.

FIG. 6 shows an essential arrangement off a sample and hold circuit in accordance with a third embodiment of the present invention. This sample and hold circuit comprises a first ringing cancel circuit 508 including a resistance 501 and a capacitor 502 connected in series with each other and a second ringing cancel circuit 506 including an analog switch 504 and a capacitor 505 connected in series with each other, in addition to the arrangement of FIG. 1. One end of the resistance 501 of the first ringing cancel circuit is connected to the non-inverted input terminal of the operational amplifier 108, while the other end of the resistance 501 is connected to the constant-potential line having the ground voltage $V_{SS}$ via the capacitor 502. Analog switch 504 of the second ringing cancel circuit, like analog switch 101 used for sampling purposes, comprises an n-channel MOS transistor whose gate terminal is supplied with sampling clock CLK via control line 110, and a p-channel MOS transistor which is supplied with complementary sampling clock XCLK via another control line 111. The analog switch 504 of the second ringing cancel circuit has two terminals, one of them being connected to a signal input line through which input voltage $V_{in}$ is entered. The other end of the analog switch 504 is connected to the non-inverted input terminal of the operational amplifier 108 via the capacitor 505.

According to the arrangement of FIG. 6, during sampling operation, two analog switches 101 and 504 are both turned on and the hold capacitor 102 is charged or discharged in proportion to the input voltage $V_{in}$. During hold operation, both of analog switches 101 and 505 are turned off, and the voltage-follower type operational amplifier 103 holds the output voltage $V_{out}$ which is proportional to the charge stored in the hold capacitor 102.

The sample and hold circuit of FIG. 6 has a transfer function $G(s) = V_{out}/V_{in}$ defined by the following formula.

$$G(s) = [\omega_t(R_c C_c s + 1)\{(R_{on} + R_d)C_d s + 1\}]/P(s) \quad (7)$$

$$\begin{aligned}P(s) = &\ R_{on}[R_c C_c (C_s + C_p)s^3 + \\ &\ (C_s + C_p + C_c + \omega_t R_c C_c C_s)s^2 + \\ &\ \omega_t(C_s + C_c)s](R_d C_d s + 1) + \\ &\ \{(R_{on} + R_d)C_d s + 1\}(R_c C_c s + 1)(s + \omega_t)\end{aligned} \quad (8)$$

where $R_{on}$ is an ON resistance of the analog switch 101, $R_c$ is a resistance value of the resistance 501. $R_d$ is an ON resistance of the analog switch 504, $C_s$ is a capacitance value of the hold capacitor 102, $C_p$ is a capacitance value of the parasitic capacitance 120, $C_c$ is a capacitance value of the capacitor 502, $C_d$ is a capacitance value of the capacitor 505, and $\omega_t = 2\pi f_t$ represents an angular frequency corresponding to the GB product $f_t$ of the operational amplifier 103.

For example, the following is the settings of the sample and hold circuit used for a base-band processing section of a digital communication MODEM circuit.

Analog signal frequency=100 kHz

Sampling frequency=2–4 MHz
$R_{on}=R_c=R_d=10$ kΩ $(=R_0)$
$C_s=C_p=C_c=C_d=1$ pF $(=C_0)$
$f_t=10$–20 MHz For the purpose of simplifying explanation, it is assumed that the following equation is established.

$$f_t=1/(2\pi R_0 C_0)=15.9 \text{ MHz}$$

An approximate expression of the denominator P(s) of the transfer function given by the formula 8 is obtained in the following manner.

$$P(s)=\{2(R_0C_0)^2s^3+6(R_0C_0)s^2+5s+1/R_0C_0\}(R_0C_0s+1) \quad (9)$$

Furthermore, an approximate expression of the transfer function G(s) is obtained from the formulas 7 and 9.

$$\begin{aligned}
G(s) &= R_0C_0\omega_t(2R_0C_0s+1)(R_0C_0s+1)/[\{2(R_0C_0)^3s^3+ \\
&\quad 6(R_0C_0)^2s^2+5(R_0C_0)s+1\}(R_0C_0s+1)] \\
&= R_0C_0\omega_t(2R_0C_0s+1)(R_0C_0s+1)/[\{2(R_0C_0)^2s^2+ \\
&\quad 4(R_0C_0)s+1\}\times(R_0C_0s+1)^2] \\
&= \omega_t(s+1/2R_0C_0)(s+1/R_0C_0)/\{R_0C_0(s+\gamma/R_0C_0)(s+ \\
&\quad \delta/R_0C_0)\times(s+1/(R_0C_0)^2\} \\
&= \omega_t(s+1/2R_0C_0)/\{R_0C_0(s+\gamma/R_0C_0)(s+ \\
&\quad \delta/R_0C_0)\times(s+1/R_0C_0)\}
\end{aligned} \quad (10)$$

where $\gamma=1-2^{-0.5}$ and $\delta=1+2^{-0.5}$.

The transfer function G(s) expressed by the formula 10 has three poles of negative real numbers. It means that the output voltage $V_{out}$ of the sample and hold circuit of FIG. 6 shows an exponential damping. That is, even if the parasitic capacitance 120 exists between the non-inverted input terminal and the inverted input terminal of the operational amplifier 108, or without increasing the GB product $f_t$ of the operational amplifier 103 so largely, the output voltage $V_{out}$ can be stabilized within a short sampling duration and, therefore, its output accuracy can be improved.

Figure 7:
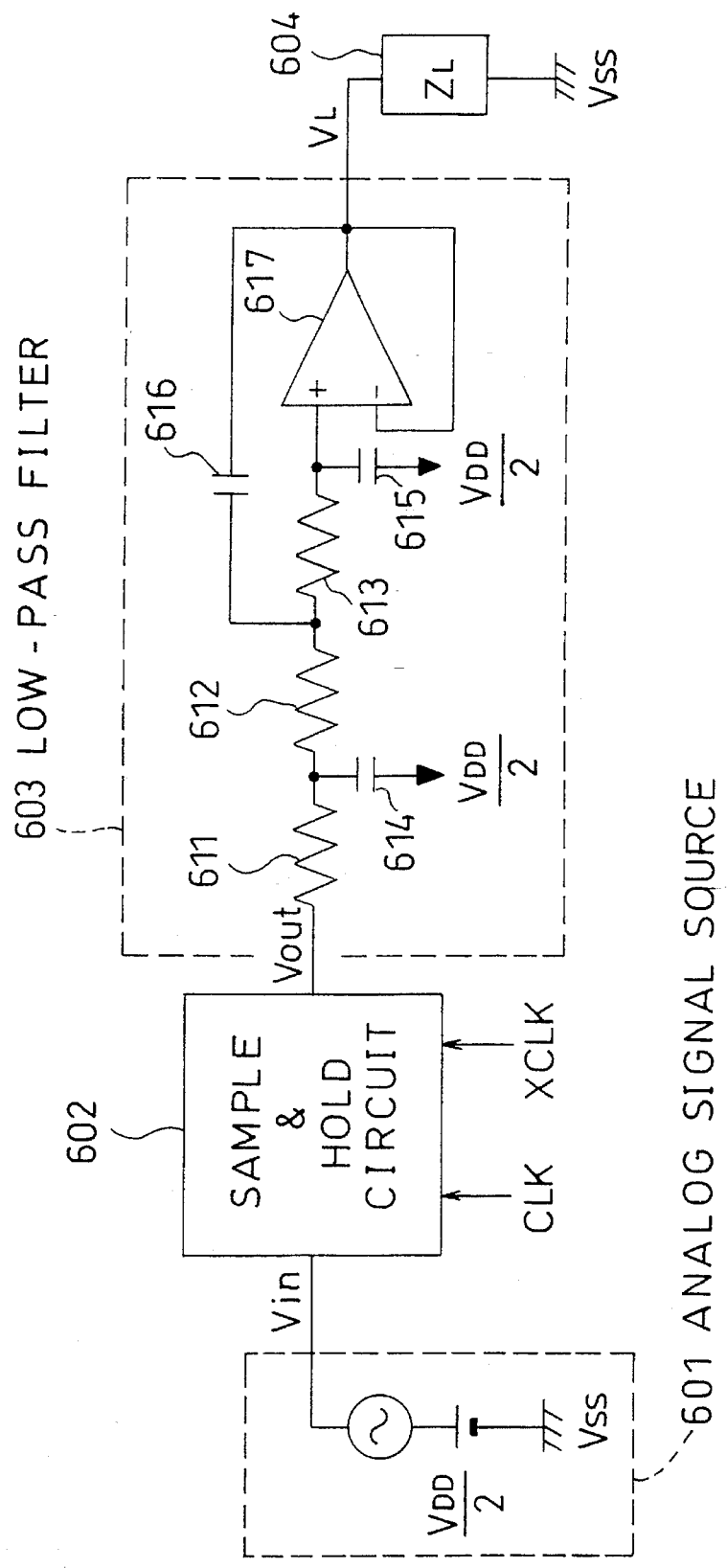
FIG. 7 is a circuit diagram showing an applied embodiment based on FIGS. 1, 2, 4 and 6 circuits.

FIG. 7 shows an applied embodiment based on sample and hold circuits of FIGS. 1, 2, 4 and 6. The embodiment of FIG. 7, which is a base-band processing section off a digital communication MODEM circuit, comprises an analog signal source 601, a sample and hold circuit 602, a low-pass filter 603, and an output load 604. The analog signal source 601, which is a circuit equivalent to a digital circuit and a DA (digital-to-analog) converter, comprises an AC signal source and a DC voltage source of $V_{DD}/2$ connected in series with each other. The AC signal source generates a sine wave voltage signal of a frequency $f_b$ (=125 kHz) and an amplitude $V_a$. The sample and hold circuit 602 has an arrangement of FIG. 1, 2, 4, or 6. The sampling frequency is 2 MHz. The low-pass filter 603 is a Butterworth filter comprising three resistances 611, 612 and 613 and three capacitors 614, 615 and 616, and one operational amplifier 617. A cut-off frequency is 250 kHz. The sample and hold circuit 602 receives an input voltage $V_{in}$ supplied from the analog signal source 601. An output voltage $V_{out}$ of this sample and hold circuit 602 is supplied to the low-pass filter 603. One end of each of two capacitors 614 and 615 in the low-pass filter 603 is connected to the constant-potential line of voltage $V_{DD}/2$. The output load 604 is expressed by an impedance $Z_L$ which is an equivalent circuit of a circuit for modulating a carrier signal of frequency 200 MHz by an output $V_L$ of the low-pass filter 603.

Figure 8:
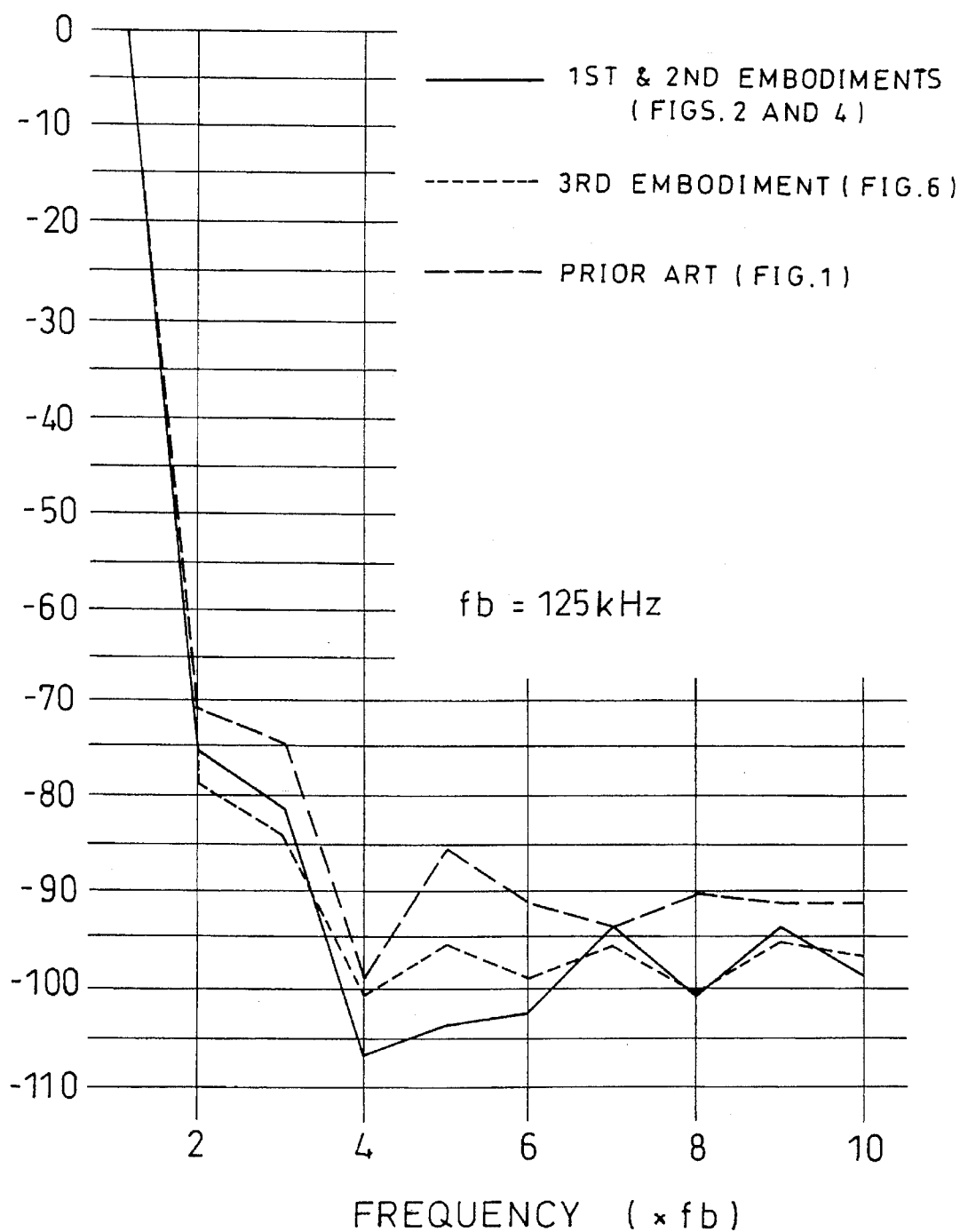
FIG. 8 is a graph showing distortion analysis result of the output voltage of the low-pass filter in the applied embodiment of FIG. 7.

Of output voltage $V_L$ of the low-pass filter 603, harmonic components other than the component of frequency $f_b$ become modulation distortion. FIG. 8 shows distortion analysis result of the output voltage $V_L$. For the sample and hold circuits shown in FIGS. 2, 4 and 6, it was possible to obtain an output voltage having distortion smaller than that of the sample and hold circuit of FIG. 1. The sample and hold circuit of FIG. 6, when compared with the sample and hold circuits of FIGS. 2 and 4, is advantageous in that secondary and tertiary harmonic components acting as chief components of distortion can be reduced. Accordingly, total harmonic distortion THD can be reduced effectively.

In the sample and hold circuit of FIG. 6, it is possible to constitute the hold capacitor 102 and the capacitor 502 of the ringing cancel circuit by a pair of MIS capacitors connected in anti-parallel with each other, and connect one end of each of capacitors 102 and 502 to the constant-potential line of voltage $V_{DD}/2$.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within the metes and bounds of the claims, or equivalents of such metes and bounds, are therefore intended to be embraced by the claims.

What is claimed is:

1. A sample and hold circuit comprising:

an analog switch having two terminals, one of which is connected to a signal input line;

a voltage-follower type operational amplifier having a non-inverted input terminal connected to the other terminal of said analog switch;

a hold capacitor interposed between said non-inverted input terminal of said operational amplifier and a constant-potential line; and a ringing cancel circuit interposed between said non-inverted input terminal of said operational amplifier and said constant-potential line said ringing cancel circuit comprising a resistance and a capacitor connected in series with each other.

2. The sample and hold circuit in accordance with claim 1, wherein said analog switch and said operational amplifier are constituted by a plurality of MOS transistors.

3. The sample and hold circuit in accordance with claim 1, wherein said constant-potential line has a ground potential.

4. The sample and hold circuit in accordance with claim 1, wherein said signal input line has a signal voltage ranging from a ground potential to a power supply voltage, and said constant-potential line has a half of said power supply voltage.

5. The sample and hold circuit in accordance with claim 4, wherein said hold capacitor is constituted by a pair of MIS capacitors connected in anti-parallel with each other.

6. The sample and hold circuit in accordance with claim 4, wherein said capacitor of said ringing cancel circuit is constituted by a pair of MIS capacitors connected in anti-parallel with each other.

7. The sample and hold circuit in accordance with claim 1, further comprising another ringing cancel circuit interposed between said signal input line and said non-inverted input terminal of said operational amplifier, wherein said another ringing cancel circuit comprises an analog switch and a capacitor connected in series with each other.

8. The sample and hold circuit in accordance with claim 7, wherein said analog switch in said another ringing cancel circuit is constituted by a plurality of MOS transistors.

* * * * *